United States Patent [19]

McDavid et al.

[11] Patent Number: 5,136,534
[45] Date of Patent: Aug. 4, 1992

[54] METHOD AND APPARATUS FOR A FILAMENT CHANNEL PASS GATE FERROELECTRIC CAPACITOR MEMORY CELL

[75] Inventors: James M. McDavid, Dallas; David R. Clark, Garland, both of Tex.

[73] Assignee: Texas Instruments Incorporated, Dallas, Tex.

[21] Appl. No.: 731,305

[22] Filed: Jul. 16, 1991

Related U.S. Application Data

[63] Continuation of Ser. No. 373,431, Jun. 30, 1989, abandoned.

[51] Int. Cl.⁵ .................. G11C 11/24; G11C 11/40
[52] U.S. Cl. ............................ 365/149; 365/174; 365/182; 365/145; 357/23.4; 357/23.6
[58] Field of Search ............. 365/145, 149, 182, 174, 365/157; 357/23.4, 23.6, 51

[56] References Cited

U.S. PATENT DOCUMENTS

| | | | |
|---|---|---|---|
| 4,129,880 | 12/1978 | Vinal | 357/23.1 X |
| 4,149,302 | 4/1979 | Cook | 357/51 X |
| 4,163,986 | 8/1979 | Vinal | 357/23 R |
| 4,200,879 | 4/1980 | Nonaka | 357/46 X |
| 4,630,088 | 12/1986 | Ogura et al. | 357/23.4 X |
| 4,688,063 | 8/1987 | Lu et al. | 365/149 X |
| 4,721,987 | 1/1988 | Baglee et al. | 365/149 X |
| 4,800,527 | 1/1989 | Ozaki et al. | 365/149 X |
| 4,811,067 | 3/1989 | Fitzgerald et al. | 365/149 X |
| 4,845,673 | 7/1989 | Chevalier | 365/149 |
| 4,873,664 | 10/1989 | Eaton, Jr. | 365/149 X |
| 4,888,630 | 12/1989 | Paterson | 357/23.5 |
| 4,888,733 | 12/1989 | Mobley | 365/149 X |
| 4,893,272 | 1/1990 | Eaton, Jr. et al. | 365/149 X |
| 4,907,047 | 3/1990 | Kato et al. | 365/149 X |
| 4,959,698 | 9/1990 | Shinichi | 357/23.6 |
| 4,985,738 | 1/1991 | Nishizawa et al. | 357/23.4 X |
| 5,001,526 | 3/1991 | Gotou | 357/23.6 |

OTHER PUBLICATIONS

Womack and Tolsch "A 16Kb Ferroelectric Non-volatile Memory with a Bit Parallel Architecture" *IEEE International Solid-State Circuits Conference* Feb. 1989, p. 242.

Evans and Womak "An Experimental 512-bit Non-volatile Memory with Ferroelectric Storage Cell" *IEEE Journal of Solid-State Circuits*, vol. 23 #5 Oct. 1988, p. 1171.

Eaton et al. "A Ferroelectric Non-volatile Memory" *IEEE International Solid-State Circuits Conference* Feb. 1988, p. 130.

Kinney et al. "A Non-volatile Memory Cell Based on Ferroelectric Storage Capacitors" *IEDM Technical Digest* Dec. 1987, p. 3.9.

*Primary Examiner*—Alyssa H. Bowler
*Attorney, Agent, or Firm*—Ira S. Matsil; James C. Kesterson; Richard L. Donaldson

[57] ABSTRACT

A memory cell is disclosed which comprises a filament channel transistor and a ferroelectric capacitor formed on a surface of a semiconductor substrate. The transistor comprises a substantially cylindrical channel filament which is formed substantially perpendicular to the substrate surface between the surface and the capacitor. The capacitor comprises a storage layer which can be formed of a ferroelectric material such that the memory cell is nonvolatile. The storage layer may also comprise a high dielectric material such that the memory cell is operable as a dynamic random access memory cell.

14 Claims, 4 Drawing Sheets

METHOD AND APPARATUS FOR A FILAMENT CHANNEL PASS GATE FERROELECTRIC CAPACITOR MEMORY CELL

This application is a continuation of application Ser. No. 07/373,431 filed Jun. 30, 1989, now abandoned.

TECHNICAL FIELD OF THE INVENTION

This invention relates in general to the field of integrated electronic devices. More particularly, the present invention relates to a memory cell and a method for constructing a memory cell comprising a filament channel transistor and a ferroelectric capacitor.

BACKGROUND OF THE INVENTION

One of the most important factors in the design and operation of modern integrated electronic devices is the speed and size of semiconductor memory devices. The ability to construct high density and high-speed random access memory cells and nonvolatile memory cells is an important concern of electronic device designers.

Currently, the state of the art memory cell uses a pass gate transistor coupled to a storage capacitor. The pass gate transistor serves as a switch to access the capacitor either to charge the capacitor when information is stored in the memory cell or to determine if the capacitor has been charged as information is read from the memory cell. Both the pass gate transistor and the capacitor are constructed either in the bulk of a semiconductor substrate or in layers built upon the semiconductor substrate. A wide variety of geometries and placements of the pass gate transistor and the capacitor have been used in the past. The majority of these geometries have used pass gate transistors and capacitors which are formed horizontally with respect to the substrate surface. This orientation of the devices inherently uses a great deal of surface area and therefore increases the necessary size of a memory array.

In addition, there have been prior attempts to use ferroelectric capacitors to form nonvolatile memory devices. Such nonvolatile memory devices comprise a capacitor using a ferroelectric material in its storage layer, and a pass gate transistor to access the ferroelectric capacitor. The nonvolatile devices have also been constructed in a primarily horizontal orientation and have thus suffered similar limitations in the resulting device size.

Therefore, a need has arisen for a memory cell geometry which achieves the maximum device density and is usable in the dynamic and nonvolatile memory applications.

SUMMARY OF THE INVENTION

In accordance with the present invention, a memory cell geometry is provided which substantially eliminates or reduces disadvantages and problems associated with prior memory cell orientations. Specifically, a memory cell is provided which comprises a vertical filament channel transistor serving as the pass gate transistor. This transistor comprises a substantially cylindrical semiconductor filament disposed substantially perpendicular to the semiconductor substrate surface. The bitline accessing the memory cell is formed in the semiconductor surface and coupled to one end of the channel filament. The wordline is formed circumferentially surrounding the filament. The storage capacitor is formed in contact with the end of the filament distal the semiconductor substrate surface.

In a specific embodiment of the present invention, the capacitor contains a high dielectric material in its storage layer such that the memory cell is operable as a dynamic random access memory cell.

In another embodiment of the present invention, the capacitor contains a ferroelectric material in its storage layer. As most ferroelectric materials are also characterized by a high dielectric constant, the memory cell of this embodiment is operable as either a dynamic random access memory cell or as a nonvolatile memory cell. In operation as a nonvolatile cell, the memory cell is used in a manner to take advantage of the remnant electric field associated with the ferroelectric nature of the storage material.

An important technical advantage of the present invention inheres in the inherent vertical orientation of the memory cell geometry. The channel of the filament channel transistor is oriented perpendicular to the substrate surface and the capacitor is able to be stacked on top of the pass gate transistor. This geometry allows for a device density heretofore unavailable in prior art geometries.

A further technical advantage of the present invention is that the memory cell of the present invention is operable as either a dynamic random access memory cell or as a nonvolatile memory cell. By using a single device geometry for two distinct device applications, circuit and device process design are greatly simplified.

BRIEF DESCRIPTION OF THE DRAWINGS

A more complete understanding of the present invention may be acquired by referring to the detailed description and claims when considered in connection with the accompanying drawings in which like reference numbers indicate like features, and wherein:

DETAILED DESCRIPTION OF THE INVENTION

Figure 1:
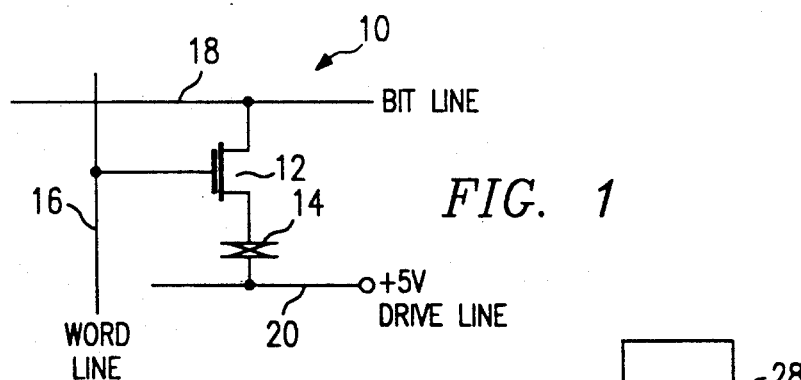
FIG. 1 is a simplified schematic drawing of a typical memory cell.

FIG. 1 illustrates the general circuit configuration of a single memory cell constructed according to prior art methods and according to the teachings of the present invention. FIG. 1 illustrates a circuit, indicated generally at 10, which includes a pass gate transistor 12 and a storage capacitor 14. The gate of the pass gate transistor 12 is coupled to a wordline 16 and the source of the pass gate transistor 12 is coupled to a bitline 18. The drain of the pass gate transistor 12 is coupled to a first electrode of the storage capacitor 14. A second electrode of the storage capacitor 14 is coupled to a drive line 20 which is coupled to a predetermined voltage level which could be, for example, +5 volts.

In operation, circuit 10 is capable of storing a single bit of information. The pass gate transistor 12 operates as a switch to control the access to the storage capacitor 14 through the bitline 18 and the wordline 16. The transistor 12 is turned on by actuating its gate through wordline 16. When the pass gate transistor 12 is turned on, the storage capacitor 14 may be programmed in the case of a write operation or the storage capacitor 14 may be sensed in the case of a read operation.

FIG. 1 illustrates a circuit configuration which can be used for a dynamic RAM application or a nonvolatile memory cell. If the storage layer of capacitor 14 is constructed using a material with a high dielectric constant, circuit 10 can be used as a dynamic random access memory cell (DRAM cell). If the storage layer of capacitor 14 is constructed using a ferroelectric material, circuit 10 may also be used as a nonvolatile memory cell. In operation, the storage layer of capacitor 14 holds a remnant electric polarity due to the hysteretic nature of the ferroelectric material.

Many ferroelectric materials also exhibit high dielectric constants. Therefore, a variety of materials could be selected to construct capacitor 14 which would allow circuit 10 to be used as either a DRAM cell or a nonvolatile memory cell. The quality of the transistor 12 would be the determining factor as to whether the cell could be used as a DRAM or a nonvolatile memory cell. A much higher quality transistor is required to allow the circuit 10 to function as a DRAM cell. If transistor 12 has too much leakage current between its source and drain, the transistor 12 in its off state will not be able to hold the voltage necessary to maintain the information stored on capacitor 14.

On the other hand, if circuit 10 is used as a nonvolatile memory cell, no voltage need be held on capacitor 14 in order to store information in the memory cell. The information is stored in the remnant electric field polarity within the ferroelectric material of capacitor 14. Because of this fact, the presence of leakage current across transistor 12 is less important.

Figure 2A:
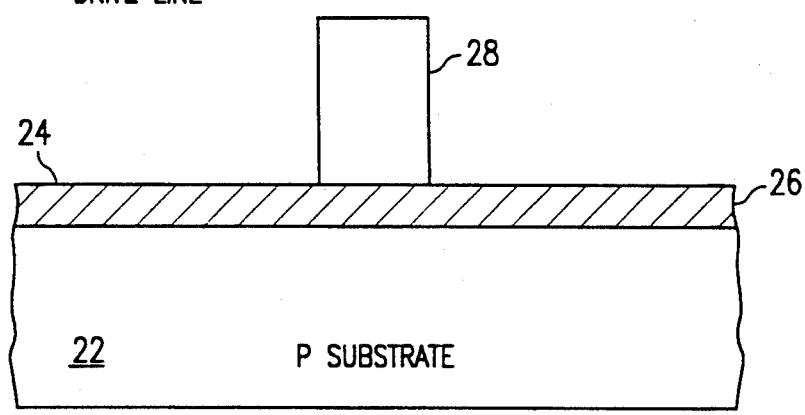
FIGS. 2a–f are cross sectional elevational diagram illustrating one series of process steps used to construct a single memory cell according to the teachings of the present invention.

Referring now to FIGS. 2a-2f, a series of enlarged cross sectional elevational diagrams illustrate the process steps necessary to construct a memory cell with contains the components shown in FIG. 1. Referring to FIG. 2a, a semiconductor substrate 22 is shown having an upper surface 24. Semiconductor substrate 22 is shown in FIG. 2a to be p-type. However, it should be understood that the teachings of the present invention are equally applicable to an n-type semiconductor substrate.

Initially, a bitline region 26 is formed on surface 24 of substrate 22. Bitline region 26 may be formed by implanting an elongate region of surface 24 with impurities to form a region of a conductivity type different than substrate 22. In FIG. 2a, bitline region 26 would comprise an n region. Alternatively, bitline region 26 could be formed by forming an elongate layer of conductive material on an upper surface of substrate 22.

Subsequently, a layer of polysilicon is deposited and etched to form a central block 28 disposed on surface 24 in contact with bitline region 26 also shown in FIG. 2a.

Figure 2B:
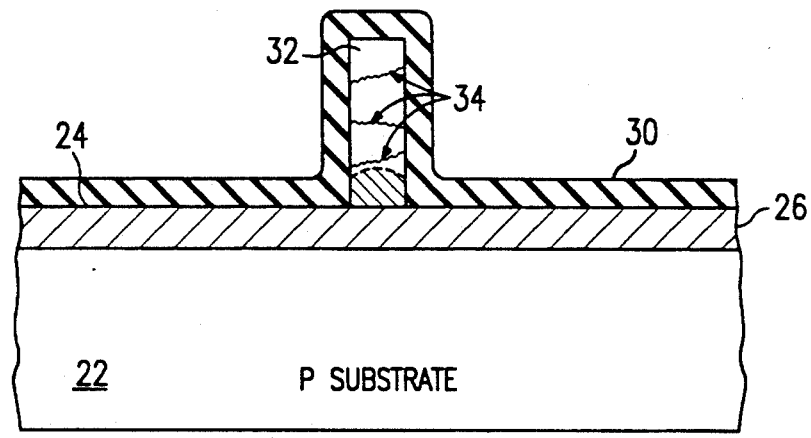

Referring now to FIG. 2b, an oxidation step grows an oxide layer 30 covering surface 24 and central block 28. The growth of the oxide layer 30 consumes the outer portion of central block 28 to form filament 32. During this oxidation step, the polycrystalline silicon in filament 32 partially recrystallizes to form grain boundaries shown at 34. The formation of the grain boundaries 34 affects the quality of the transistor which will be formed using the filament 32. Grain boundaries are the boundaries between the single crystalline regions in a polycrystalline material. Dopants which diffuse along grain boundaries create conduction paths through polycrystalline semiconductor materials which are not subject to the traditional selectable conduction associated with single crystal semiconductor material. Grain boundaries 34 are illustrative of a grain boundary profile which does not provide a conduction path for leakage current through filament 32. Grain boundaries 34 run primarily perpendicular to the current flowing through filament 32 and therefore do not provide a continuous conduction path for leakage current. The operational characteristics of the transistor formed using filament 32 as the channel region are therefore comparable to transistors formed in single crystal bulk semiconductor material. In the next step, oxide layer 30 is removed. Additionally, during the oxidation process, dopants diffuse from bitline region 26 into the end of filament 32 adjacent the substrate surface. It is essential that the end portions of filament 32 which are not adjacent the gate conductor to be formed subsequently be rendered conductive to provide for a reasonable threshold voltage.

Figure 2C:
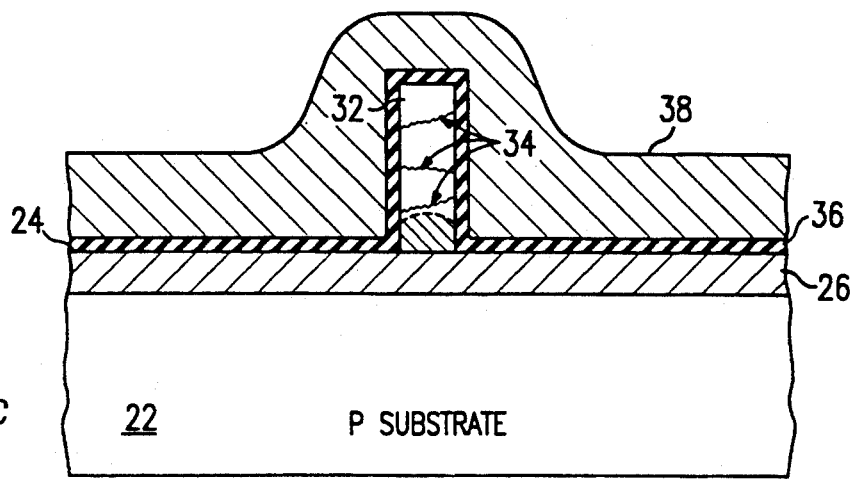

Referring to FIG. 2c, a gate oxide 36 of approximately 250 Angstroms in thickness is then grown covering surface 24 and filament 32. Preferably, filament 32 is substantially cylindrical in shape. However, a variety of cross sectional shapes could easily be formed by altering the formation of the central block 28. After the formation of gate oxide layer 36, a layer 38 of heavily doped polycrystalline silicon is conformally deposited over the gate oxide layer 36 as shown in FIG. 2c.

Figure 2D:
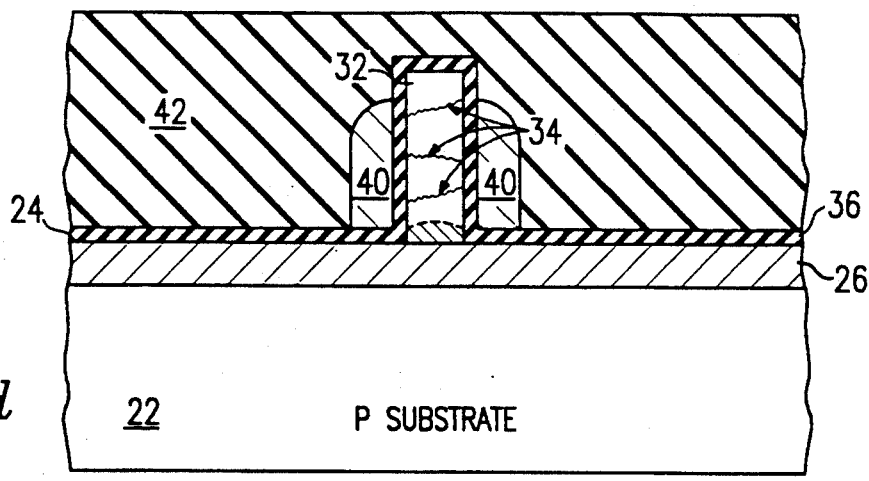

Referring now to FIG. 2d, the polycrystalline silicon layer 38 is anisotropically etched to leave wordline 40 shown in FIG. 2d. Wordline 40 is an elongate region of conductive polycrystalline which is insulatively disposed around the filament 32 and which runs in a direction perpendicular to the plane of the cross section of FIG. 2. In other words, bitline 26 and wordline 40 are elongate conductive regions which intersect at the point shown in FIG. 2. The filament 32 passes through the center of wordline 40 and contacts bitline 26 at this intersection point.

Figure 2E:
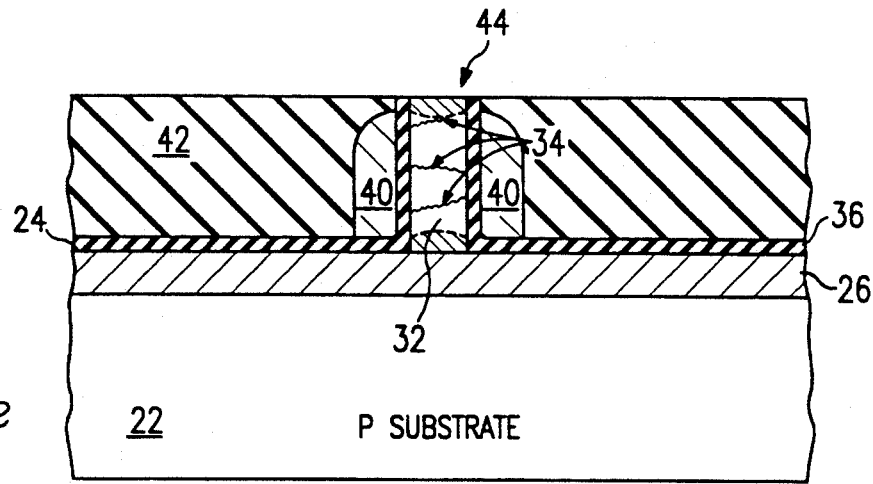

In the next step, a thick oxide layer 42 is deposited over the entire surface and the structure is planarized to expose the upper surface 44 of filament 32 as shown in FIG. 2e. At this point, it is convenient to dope the upper portion of filament 32 through surface 44 to render the portion of filament 32 which is not adjacent of wordline 40 conductive.

Figure 2F:
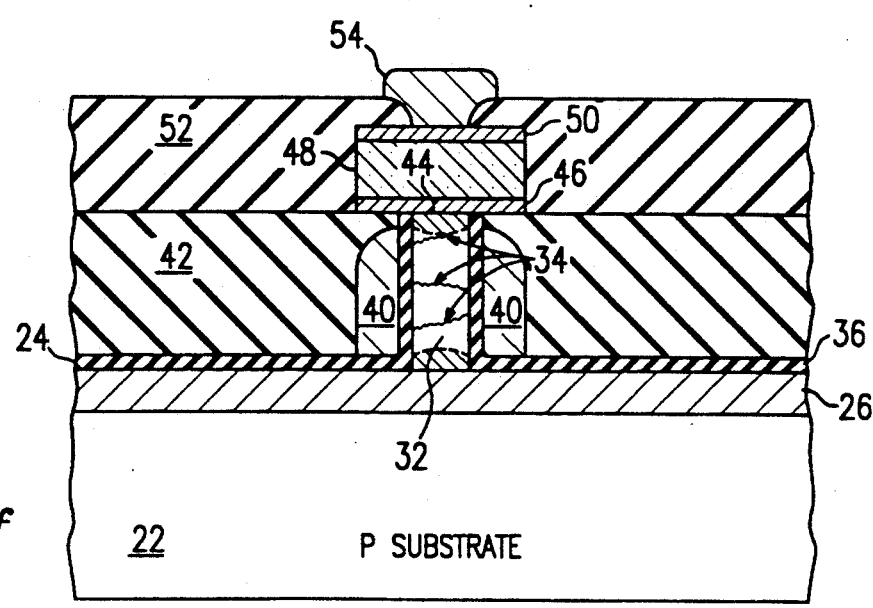

The final structure of the memory cell is shown in FIG. 2f. In order to complete the memory cell, a first electrode 46 is formed in contact with the upper surface 44 of filament 32. Electrode 46 may be suitably formed of a variety of conductive materials such as nichrome. Generally, electrode 46 should not be formed of a conductive material which has an inherent native oxide such as aluminum. An inherent native oxide produces a capacitance which would impede the optimum performance of the device.

A storage layer 48 is then formed on first electrode 46 and a second electrode 50 is formed on storage layer 48. Storage layer 48, as described previously, can be a ferroelectric material such as PZT or barium strontiumate. If storage layer 48 is constructed using a ferroelectric material, the memory cell is operable as a nonvolatile memory cell. Additionally, as most ferroelectric materials are also characterized by a high dielectric constant, the memory cell can also be used as a DRAM cell by storing charge in the storage layer 48.

In the final process steps, an isolation layer 52 of oxide is deposited covering the entire structure. An aperture is then opened through the isolation layer 52 and contact electrode 54 is formed to contact second electrode 50.

FIG. 3 illustrates an alternative method of forming the memory cell according to the teachings of the present invention. The device is constructed on a semiconductor substrate 56 which is shown in FIG. 3a to be p-type. It should be understood that the teachings of the present invention are equally applicable to constructing a device on an n-type substrate. A bitline 58 is implanted or deposited on the upper surface 60 of substrate 56 as was discussed in reference to FIG. 2a. A first oxide layer 62 is grown on the upper surface 60 of substrate 56. Oxide layer 62 is approximately 3000 Angstroms thick and serves to prevent unwanted capacitance from developing between the bitline and the wordline of the device.

A layer of heavily doped polycrystalline silicon is then deposited on the upper surface of oxide layer 62 and etched to form wordline 64.

Figure 3A:
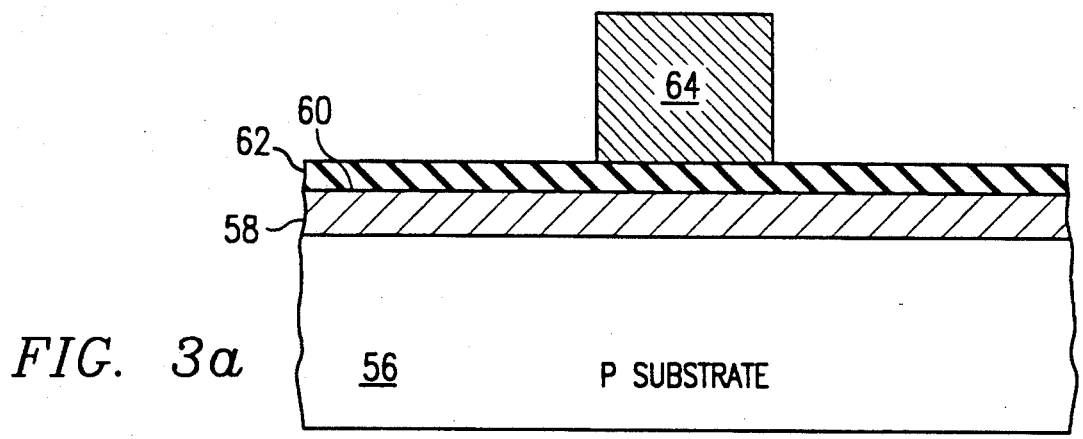
FIGS. 3a–e are cross sectional diagrams illustrating a second series of process steps for constructing a memory cell according to the teachings of the present invention.
Figure 3B:
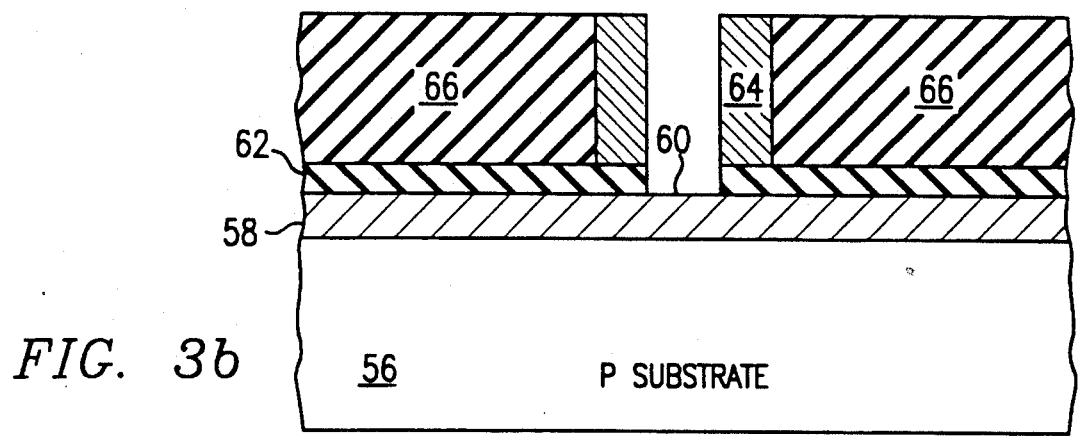

Referring to FIG. 3b, a thick oxide layer 66 is deposited over the surface of oxide layer 62 and wordline 64 and the structure is planarized to expose the upper surface of wordline 64. An aperture is then formed through wordline 64 and oxide layer 62 to expose the upper surface 60 of substrate 56.

Figure 3C:
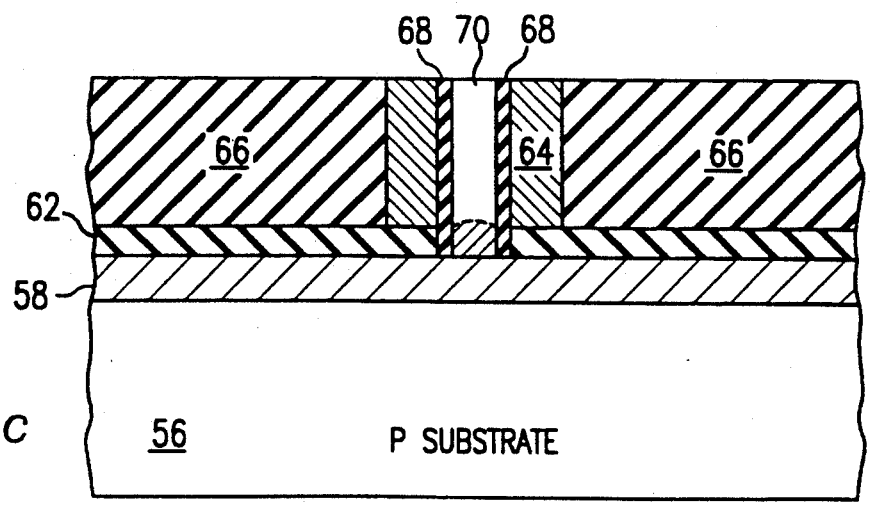

Referring to FIG. 3c, a thin gate oxide layer 68 is then grown on the exposed surfaces of wordline 64 and surface 60 of substrate 56. This oxide layer is anisotropically etched to remove all horizontal portions of the gate oxide 68. This leaves the portions of gate oxide 68 covering the vertical portions of wordline 64 as shown in FIG. 3c. A layer of polycrystalline silicon is then deposited and etched back to fill the aperture and form a channel filament 70. The channel filament 70 is formed in contact with bitline 58 and gate oxide 68. Channel filament 70 is preferably substantially cylindrical in cross section. During later processing steps, dopant from bitline region 58 diffuse into the adjacent portion of channel filament 70 such that the portion of channel filament 70 which is not adjacent wordline 64 is rendered conductive.

At this stage, the difference between the process illustrated in FIG. 3 and the process illustrated in FIG. 2 can be seen most clearly. The process used to construct the apparatus according to the present invention illustrated in FIG. 2 begins with the channel filament as a free standing structure disposed on the surface of the substrate. The process illustrated in FIG. 3 forms the channel filament by filling an aperture opened in the wordline 64. The channel filament in FIG. 2 is less durable structure which could possibly break off during processing, and thus may affect the overall throughput of the production process. However, because the channel filament is a free standing structure as illustrated in FIG. 2b, the oxidation process enables grain growth which results in the grain boundaries 34 which affect the conductivity profile of the channel filament 32. Additional process steps would be required to form similar grain boundaries in the channel filament 70 illustrated in FIG. 3c. While the growth of grains resulting in grain boundaries 34 in the channel filament 70 is certainly possible, it is unlikely that the conductivity profile would be as high a quality and as close to that of a bulk transistor as the channel filament 32 shown in FIG. 2. Therefore, the process illustrated in FIG. 3 illustrates a more durable process than the process illustrated in FIG. 2, but will most likely result in a transistor which has a greater leakage current than a transistor constructed using the processes in FIG. 2.

As discussed previously, the quality of the transistor is much less important if the memory cell is used in a nonvolatile application. Thus, if a ferroelectric capacitor is constructed in contact with the channel filament, the leakage current of the pass gate transistor is of little importance, because there is no requirement that the capacitor hold a voltage as in the dynamic random access memory cell application. The different processes illustrated in FIGS. 2 and 3 could thus be selected according to the intended application of the memory cell as a dynamic memory cell or as a nonvolatile memory cell. The process illustrated in FIG. 2 would therefore be more applicable to the construction of a dynamic memory cell application and the process illustrated in FIG. 3 would be more applicable to the construction of a nonvolatile memory cell application.

Figure 3D:
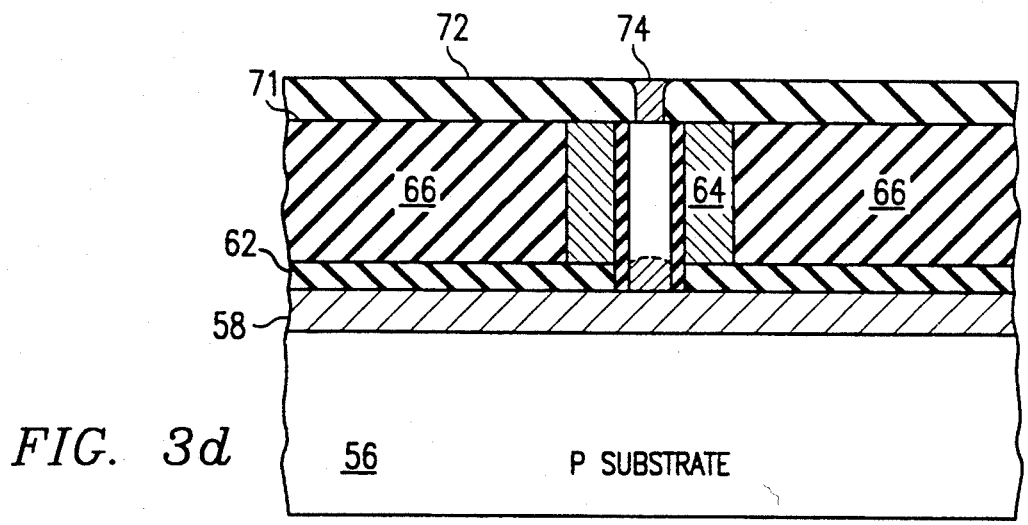

Referring to FIG. 3d, an isolation layer of oxide 72 is then deposited on the planarized surface 71. An aperture is opened in the isolation oxide layer 72 and a contact 74 is deposited in the aperture. Contact 74 may be formed of a conductive material such as tungsten. Contact 74 is not required but serves to make contact with the channel filament 70 and allow a planar profile for the formation of the first electrode of the storage capacitor.

Figure 3E:
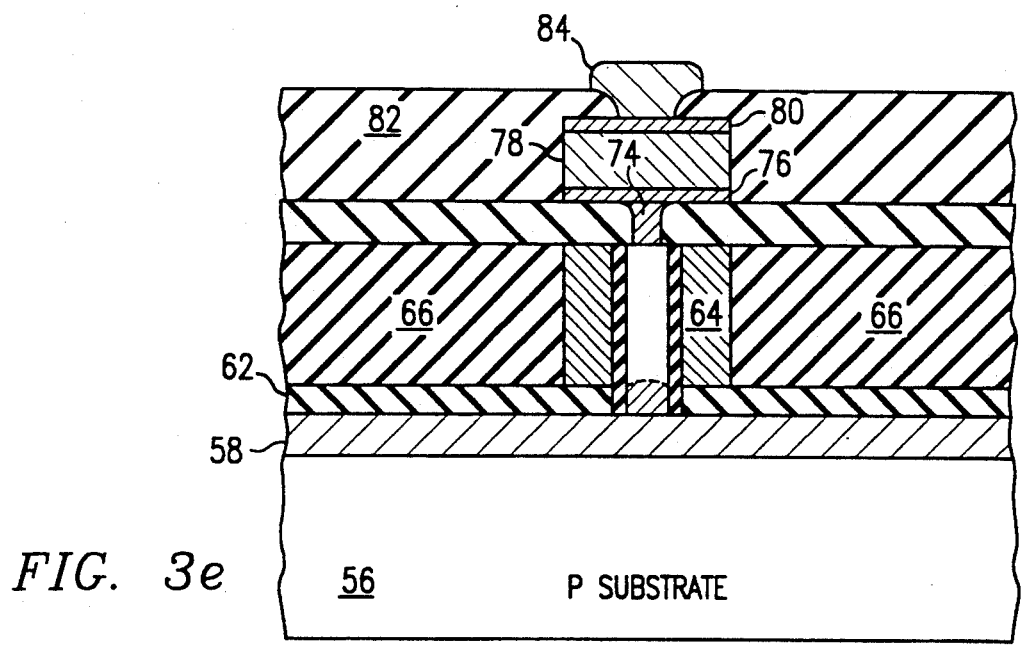

Referring to FIG. 3e, the final structure of the memory cell is shown. The storage capacitor is formed in a manner similar to that discussed with reference to FIG. 2f, and comprises a first electrode 76, a storage layer 78 and a second electrode 80. An isolation layer 82 of oxide is deposited over the entire structure and an opening is formed such that a contact electrode 84 may be formed to provide contact with the second electrode 80. As discussed with reference to FIG. 2, the electrodes 76 and 80 are preferably formed of a conductor which does not have a inherent native oxide which would create a detrimental capacitance. The storage layer 78 may comprise a variety of high dielectric or ferroelectric materials. In operation, the wordline is used as the gate of the pass gate transistor to actuate the channel filament 70. When the pass gate transistor is activated by the wordline 64, the storage capacitor is accessible through the bitline 58.

Figure 4:
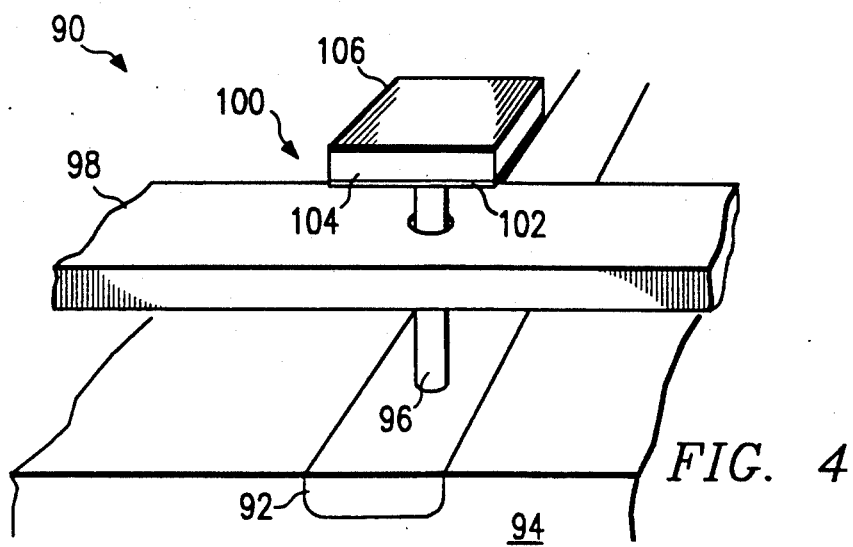
FIG. 4 shows an isometric representation of a single memory cell 90.

FIG. 4 shows an isometric representation of a single memory cell 90. FIG. 4 is a greatly simplified representation of memory cell 90 which illustrates the general structure and relationship of a memory cell constructed according to the teachings of the present invention. A bitline 92 is shown formed in a substrate 94. As described earlier, bitline 92 may be formed by diffusing dopants into substrate 94 or by selectively depositing an elongate strip of conductive material on to the surface of substrate 94. A filament channel 96 is shown having one end in contact with bitline 92. A wordline 98 is shown disposed about the filament channel 96.

The storage capacitor, indicated generally at 100, is constructed in contact with the filament channel 96. Storage capacitor 100 comprises a first electrode 102, a storage layer 104 and a second electrode 106.

FIG. 4 illustrates the general layout of the memory cell 90. Wordline 98 is substantially perpendicular to bitline 92. In addition, the filament channel 96 which forms the pass gate transistor to access the storage capacitor 100 is constructed vertically substantially perpendicular to the surface of substrate 94. Because of the general vertical construction of the memory cell 90, the cell 90 uses a minimal amount of surface area of the substrate 94. Because of this advantage, an array of memory cells similar to cell 90 can be constructed with the memory cells extremely close together.

In summary, a memory cell has been described which comprises a filament channel transistor constructed between a substrate surface and a storage capacitor. The vertical filament channel is actuated by a wordline which is disposed about the filament channel. The storage layer within the storage capacitor may comprise a dielectric or a ferroelectric material. The general structure of the memory cell is thereby applicable to be used as either a dynamic random access memory cell or a nonvolatile memory cell. The pass gate transistor used for the memory cell of the present invention is fully described in Applicant's copending patent application entitled "Filament Channel Transistor", Ser. No. 374,335, filed concurrently herewith, and application Ser. No. 614,960 which is a continuation thereof.

Although the present invention has been described in detail, it should be understood that various changes, substitutions and alterations can be made hereto without department from the spirit and scope of the invention as defined by the appended claims.

What is claimed is:

1. A memory cell formed on a surface of a substrate and coupled to a wordline and a bitline, comprising:
   a substrate;
   a bitline formed at the surface of said substrate;
   a transistor, said transistor having a channel comprising a substantially cylindrical semiconductor filament, said channel formed on said bitline and extending substantially perpendicular to and away from said substrate and bitline, an end of said filament coupled to the bitline, the wordline disposed about said filament such that the wordline is operable to actuate said channel; and
   a capacitor comprising a first electrode, a second electrode and a storage layer, said first electrode formed substantially vertically above and coupled to an opposite end of said filament such that said filament is between said bitline and said first electrode, said storage layer formed substantially vertically above said first electrode and second electrode formed substantially vertically above said storage layer, said second electrode coupled to a predetermined voltage level.

2. The memory cell of claim 1, wherein said storage layer comprises a dielectric material such that said capacitor is operable as a substantially linear capacitor and the memory cell is operable as a dynamic random access memory cell.

3. The memory cell of claim 1, wherein said storage layer comprises a ferroelectric material such that said capacitor is operable as a nonlinear hysteretic capacitor and the memory cell is operable as a nonvolatile memory cell.

4. The memory cell of claim 1 and further comprising an insulative layer disposed between the wordline and said filament.

5. The memory cell of claim 4, wherein said insulative layer comprises oxide.

6. The memory cell of claim 1 wherein said bitline is formed in the surface of said substrate.

7. The memory cell of claim 1 wherein said bitline comprises a conductive material on an upper surface of said substrate.

8. A memory cell formed on a surface of a substrate of a first conductivity type, comprising:
   a substrate;
   a conductive bitline formed in the substrate to be of a second conductivity type;
   a substantially cylindrical channel filament formed substantially perpendicular to and extending away from and fully above the surface and having a first end coupled to said bitline;
   a conductive wordline insulatively disposed about said filament;
   a first electrode formed substantially vertically above and coupled to the second end of said filament;
   a storage layer formed substantially vertically above and adjoining said first electrode; and
   a second electrode formed substantially vertically above and adjoining said capacitor storage body and coupled to a predetermined voltage level.

9. The memory cell of claim 8, wherein said wordline comprises polycrystalline silicon.

10. The memory cell of claim 8 and further comprising an insulative layer disposed about said filament between said filament and said wordline.

11. The memory cell of claim 10, wherein said insulative layer comprises oxide.

12. The memory cell of claim 8, wherein said first and second electrodes comprise nichrome.

13. The memory cell of claim 8 wherein said storage layer comprises a dielectric material.

14. The memory cell of claim 8 wherein said storage layer comprises a ferroelectric material.

* * * * *